(12) United States Patent
Uchida et al.

(10) Patent No.: US 8,097,850 B2
(45) Date of Patent: Jan. 17, 2012

(54) INFRARED SENSOR

(75) Inventors: Yuichi Uchida, Hirakata (JP); Hiroshi Yamanaka, Moriguchi (JP); Koji Tsuji, Suita (JP); Masao Kirihara, Kadoma (JP); Takaaki Yoshihara, Osaka (JP); Youichi Nishijima, Osaka (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 409 days.

(21) Appl. No.: 12/302,024

(22) PCT Filed: May 23, 2007

(86) PCT No.: PCT/JP2007/060937
§ 371 (c)(1),
(2), (4) Date: Nov. 23, 2008

(87) PCT Pub. No.: WO2007/139123
PCT Pub. Date: Dec. 6, 2007

(65) Prior Publication Data
US 2010/0230595 A1    Sep. 16, 2010

(30) Foreign Application Priority Data

May 25, 2006  (JP) .................................. 2006-145818
May 25, 2006  (JP) .................................. 2006-145819

(51) Int. Cl.
*G01J 5/20* (2006.01)

(52) U.S. Cl. .................................. 250/338.4; 250/338.1
(58) Field of Classification Search ............... 250/338.4, 250/338.1
See application file for complete search history.

(56) References Cited

U.S. PATENT DOCUMENTS

| | | | |
|---|---|---|---|
| 5,541,412 A | 7/1996 | Tanaka et al. | |
| 5,688,699 A * | 11/1997 | Cunningham et al. | 438/54 |
| 5,701,008 A | 12/1997 | Ray et al. | |
| 5,852,321 A | 12/1998 | Tohyama | |
| 6,034,374 A | 3/2000 | Kimura et al. | |
| 6,359,276 B1 | 3/2002 | Tu | |
| 6,690,014 B1 | 2/2004 | Gooch et al. | |
| 7,268,350 B1 * | 9/2007 | Ouvrier-Buffet et al. | 250/338.1 |

(Continued)

FOREIGN PATENT DOCUMENTS

CN  2363385 Y  2/2000

(Continued)

OTHER PUBLICATIONS

The First Office Action for Application No. 200780020773.4 from The State Intellectual Property Office of the People's Republic of China dated Dec. 18, 2009.

(Continued)

*Primary Examiner* — David Porta
*Assistant Examiner* — Christine Sung
(74) *Attorney, Agent, or Firm* — Cheng Law Group, PLLC (57) ABSTRACT

To improve thermal insulation, a thermal infrared sensing element is carried on a sensor mount of a porous material and is spaced upwardly from a substrate by means of anchor studs projecting on the substrate. The sensor mount is formed with a pair of coplanar beams carry thereon leads extending from the sensing element. The leads and the beams are secured to the upper ends of the anchor studs to hold the sensing element at a predetermined height above the substrate. The beams and the leads are combined with each other by intermolecular adhesion such that the sensing element as well as the sensor mount can be altogether supported to the anchor studs.

12 Claims, 12 Drawing Sheets

U.S. PATENT DOCUMENTS

2006/0166407 A1 * 7/2006 Kaushal et al. ............... 438/115

FOREIGN PATENT DOCUMENTS

| | | |
|---|---|---|
| CN | 1251945 A | 5/2000 |
| JP | 7-147433 A | 6/1995 |
| JP | 7-318416 A | 12/1995 |
| JP | 9-246508 A | 9/1997 |
| JP | 10-185681 A | 7/1998 |
| JP | 10-239157 A | 9/1998 |
| JP | 11-258038 A | 9/1999 |
| JP | 11-337403 A | 12/1999 |
| JP | 2000-097765 A | 4/2000 |
| JP | 2001-210877 A | 8/2001 |
| JP | 2002-205299 A | 7/2002 |
| JP | 2003-532067 A | 10/2003 |
| JP | 2004-79932 A | 3/2004 |
| JP | 2006-126203 A | 5/2006 |
| JP | 2007-263768 A | 10/2007 |
| JP | 2007-263769 A | 10/2007 |
| JP | 2007-292561 A | 11/2007 |
| JP | 2007-292562 A | 11/2007 |
| JP | 2007-315916 A | 12/2007 |
| JP | 2007-316076 A | 12/2007 |
| JP | 2007-316077 A | 12/2007 |
| JP | 2008-2912 A | 1/2008 |
| WO | WO-2007/021030 A1 | 2/2007 |

OTHER PUBLICATIONS

Notice to Submit a Response for the Application No. 10-2008-7028603 from Korean Intellectual Property Office dated Jul. 27, 2010.

International Search Report for the Application No. PCT/JP2007/060937 mailed Aug. 27, 2007.

Notification of Reasons for Refusal for Application No. 2007-153012 from Japan Patent Office mailed Jul. 12, 2011.

Notification of Reasons for Refusal for Application No. 2007-138272 from Japan Patent Office mailed Aug. 16, 2011.

* cited by examiner

ND SENSOR

TECHNICAL FIELD

The present invention is directed to an infrared sensor with a thermal infrared sensing element mounted on a substrate

BACKGROUND ART

U.S. Pat. No. 6,359,276 discloses an infrared sensor composed of a thermal infrared sensing element and a semiconductor device which are arranged in a side-by-side relation on top of a semiconductor substrate. The thermal infrared sensing element is held on a sensor mount which is formed in the top surface of the substrate as being supported by means of beams extending from the sensor mount to a remainder of the substrate. The sensor mount and the beams are defined by a portion of the top surface of the substrate which is converted into a porous structure for thermal insulation of the infrared sensing element from the remainder of the substrate. That is, the sensor mount and the beams are formed by anodizing a top part of a doped region formed in the surface of the semiconductor substrate into a porous body. Thus, the prior art makes the best use of the semiconductor substrate to realize the sensor mount in the top surface of the substrate. However, since the sensor mount is limited to within the top surface of the substrate, it is practically impossible to form the semiconductor device in the semiconductor substrate immediately below the sensor mount or the senor element. More specifically, since the porous beams extend only within the top surface of the substrate, the sensor mount cannot be lifted above a general top plane of the substrate.

Japanese patent publication No. 2000-97765 discloses another prior art in which a sensor mount is supported in a spaced relation from a substrate to mount an infrared sensing element for making sufficient thermal insulation of the sensing element from the substrate. In this instance, the sensor mount is supported by means of beams which slant downwardly and outwardly from the sensor mount and terminate on the substrate. The beams as well as the sensor mount are made of a silicon oxide or silicon nitride which is assumed to give a sufficient mechanical strength for supporting the sensor mount and the infrared sensing element in a spaced relation from the top surface of the substrate. Nevertheless, such supporting structure using the slanting beams is found not suitable for maintaining the infrared sensing element accurately at a desired height. The accurate positioning with respect to the height is particularly important when a plurality of the sensing elements is arranged in a two-dimensional array. When the beams and the sensor mount are required to be made of a porous material for enhanced thermal insulation as in the above U.S. patent, however, the supporting structure of the sensor mount is not sufficient for stably supporting the infrared sensor with the use of the slanting beams, and therefore requires a specific design which is not derived from either of the above publications.

DISCLOSURE OF THE INVENTION

In view of the above problem, the present invention has been accomplished to realize an infrared sensor of an advantageous structure which enables the use of a porous material for supporting the infrared sensor element in a spaced relation from a top surface of a substrate, yet assuring to stably maintain an infrared sensing element accurately at an intended height.

The infrared sensor in accordance with the present invention includes a substrate, a sensor unit carried on the substrate, and a sealing cap secured to the substrate to provide a hermetically sealed space therebetween for accommodating the sensor unit. The sensor unit includes a thermal infrared sensing element, a sensor mount carrying thereon the infrared sensor, a pair of beams extending integrally from the sensor mount to the substrate for supporting the sensor mount in a spaced relation upwardly from a top surface of the substrate; and a pair of terminal lands formed on the top surface of the substrate. The sensor mount and the beams are made of a porous material for making sufficient thermal insulation of the infrared sensing element from the substrate. The sealing cap has a window which passes an incident infrared radiation on the thermal infrared sensing element. The infrared sensing element has a pair of leads each supported on top of each of the beams to extend along the beam for electrical connection with each corresponding one of the terminal lands.

The leads are carried respectively on the beams which extend in the same plane of the sensor mount in a spaced relation from the top surface of the substrate. The sensor unit further includes a pair of anchor studs each upstanding from each of the terminal lands and connected at its upper end to a distal end of each corresponding one of the leads of the sensing element. Thus, the sensing element is supported together with the sensor mount on the substrate by means of the anchor studs, and is held in a spaced relation from the top surface of the substrate, while the sensing element is electrically connected to the terminal lands on the substrate through the anchor studs. With this arrangement, the anchor studs bear the leads and therefore the infrared sensing element, thereby maintaining the infrared sensing element at a constant height above the top surface of the substrate. Further, the upper end of each of the anchor studs is embedded in each corresponding one of the beams so as to have its circumference entirely surrounded by each corresponding one of the beams. Consequently, the beams of the porous material can be successfully engaged respectively with the anchor studs so that the sensor mount can be secured to the anchor studs for backing up the infrared sensing element. Accordingly, the infrared sensing element can be maintained exactly at the intended height as being successfully backed up by the sensor mount and the beams of the porous material for enhanced thermal insulation from the top surface of the substrate.

Preferably, each lead is formed on each corresponding one of the beams by deposition. In this instance, each of the anchor studs has its upper end fitted within a hole formed in the end of each corresponding one of said beams, and is formed at its upper end with a flange which overlaps the beam around the hole and is connected to each corresponding one of the leads. The flange gives an increased contact area between the anchor stud and the beam to enhance intermolecular adhesion of the beams of the porous material to the anchor stud, thereby keeping the beams and the sensor mount at the constant height above the top surface of the substrate.

Each lead and the associated anchor stud may be commonly made of an electrically conductive material to be continuous with each other so that the lead and the anchor stud can be formed by a single step.

Alternatively, the lead and the anchor stud may be formed by separate steps so that the flange of each anchor stud has a portion overlapped with the end of the associated lead to be bonded together thereat. In this instance, the anchor stud is preferred to have a uniform thickness greater than that of the lead. With this arrangement, the anchor stud is given a sufficient mechanical strength for supporting the infrared sensing element and the sensor mount, while the lead can have a reduced thickness for improved sensitivity of the infrared sensing element.

Each of the anchor studs may be surrounded along its vertical length by each one of sleeves of a porous material for thermal insulation also around the anchor stud. The sleeve can also acts as an additional support for the end of the beam. In this connection, the sleeve may be formed integrally with the beam as an integral part thereof.

The porous material may be one of a silicon oxide, a siloxane-based organic polymer, and a siloxane-based inorganic polymer.

The hermetically sealed space is preferred to be decompressed for enhanced thermal insulation between the infrared sensor element and the substrate.

In a preferred embodiment, a plurality of the sensor units is arranged in an array commonly on the substrate. In this instance, the sensing elements of the plural sensor units can be maintained at a constant height from the top surface of the substrate so as to assure consistent outputs from each of the sensor units.

The window of the sealing cap may be provided with a lens array in which a plurality of optical lenses are arranged in an array so as to converge the incident infrared radiation on said infrared sensor of any one of said sensor units. In this connection the lens array may be integrally formed with the sealing cap to form a part of the sealing cap.

Alternatively, the lens array may be superimposed on the window on a surface of the sealing cap opposed to the sensor units. In this case, the lens array is configured to have a refractive index smaller than that of the window. Thus, the infrared radiation can be directed through the media of refractive indexes smaller towards the sensing element so as to reduce a total loss of reflections at respective interfaces between the window and outside atmosphere, between the window and the lens, and between the lens and a medium in the hermetically sealed space, thereby increasing an amount of the infrared radiation received at the infrared sensing element for improved response.

BEST MODE FOR CARRYING OUT THE INVENTION

Figure 1:
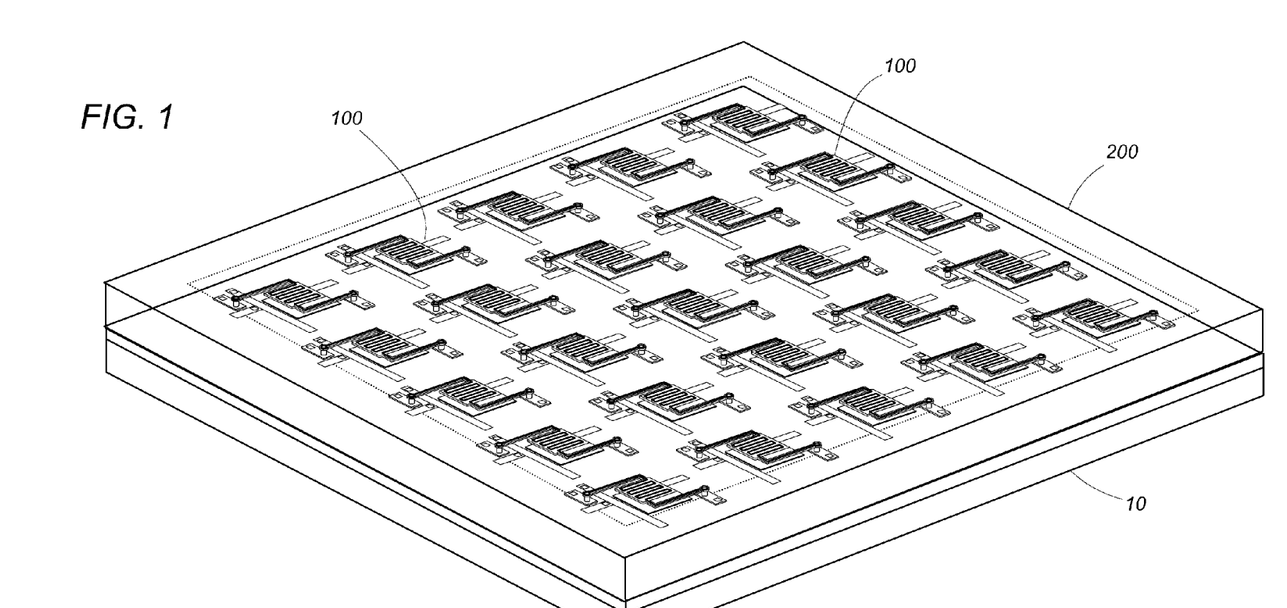
FIG. 1 is a perspective view of an infrared sensor in accordance with a first embodiment of the present invention.
Figure 2:
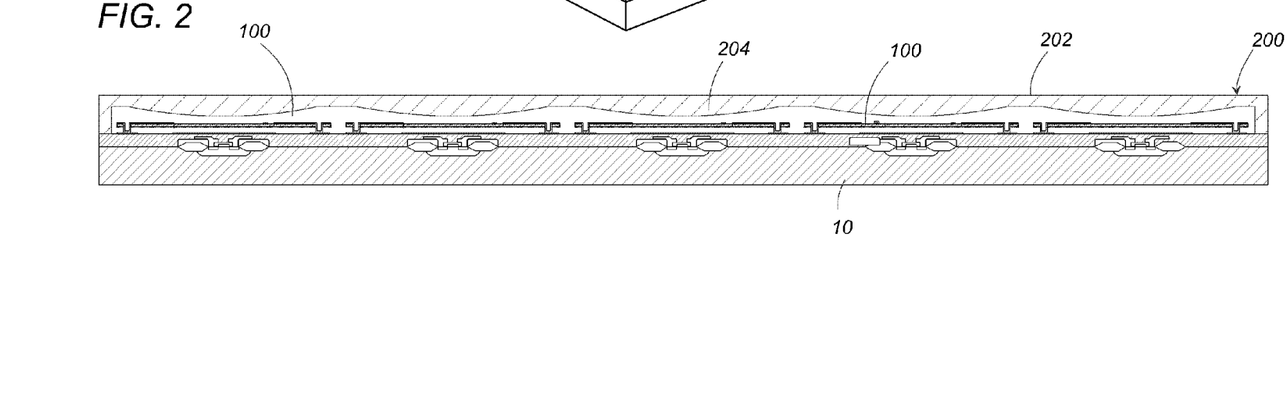
FIG. 2 is a sectional view of the above infrared sensor.
Figure 3:
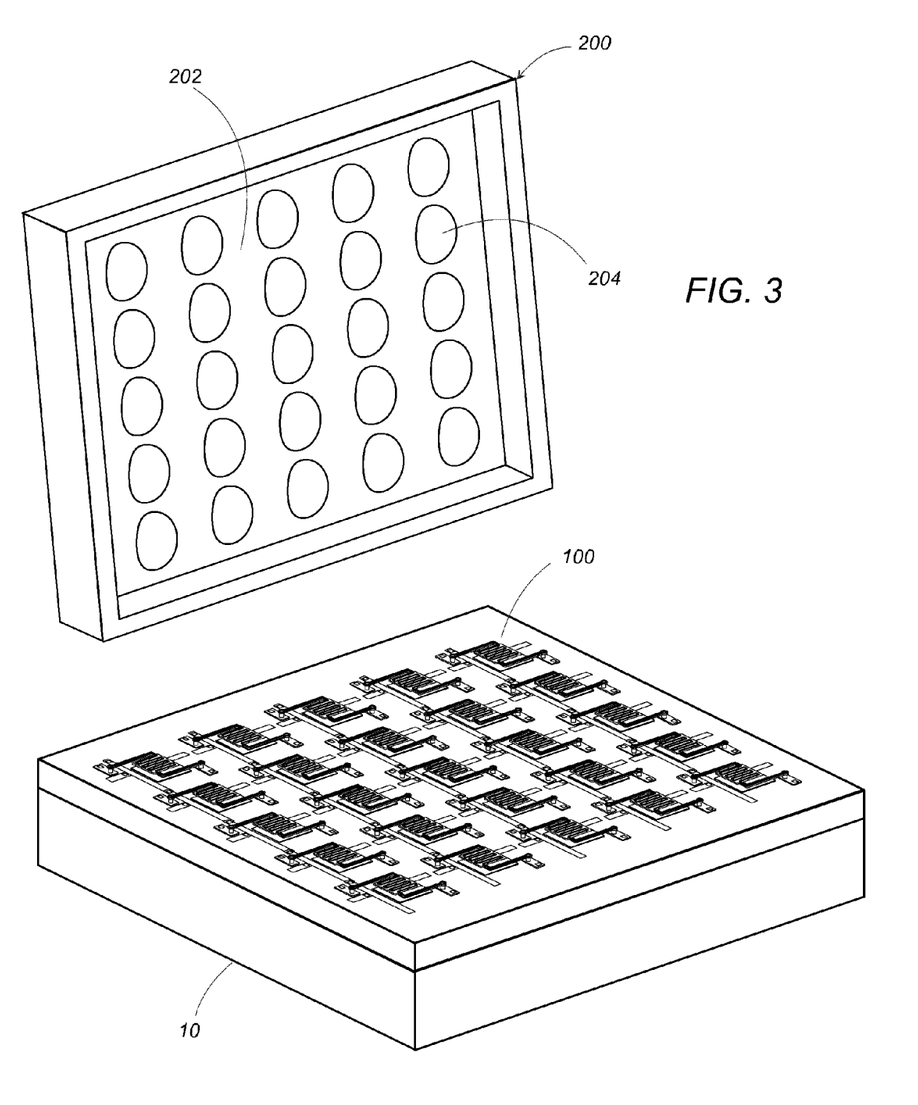
FIG. 3 is an exploded perspective view of the above infrared sensor.

Referring now to FIGS. 1 to 3, there is shown an infrared sensor in accordance with a first embodiment of the present invention. The infrared sensor includes a plurality of sensor units 100 arranged in a two-dimensional array to constitute a thermal image sensor, although the present invention is not limited thereto. The sensor units 100 are commonly formed on a single semiconductor substrate 10 and are accommodated within a hermetically sealed space defined between the substrate 10 and a sealing cap 200 secured thereto. The sealed space is decompressed to be thermally insulated from the atmosphere. The sealing cap 200 is made of silicon to provide a window 202 transparent to infrared radiation for directing it to the sensor units 100. The window 202 is formed integrally with a lens array having a plurality of convex lenses 204 each corresponding to each of the sensor units 100 for converging the infrared radiation thereto.

Figure 4:
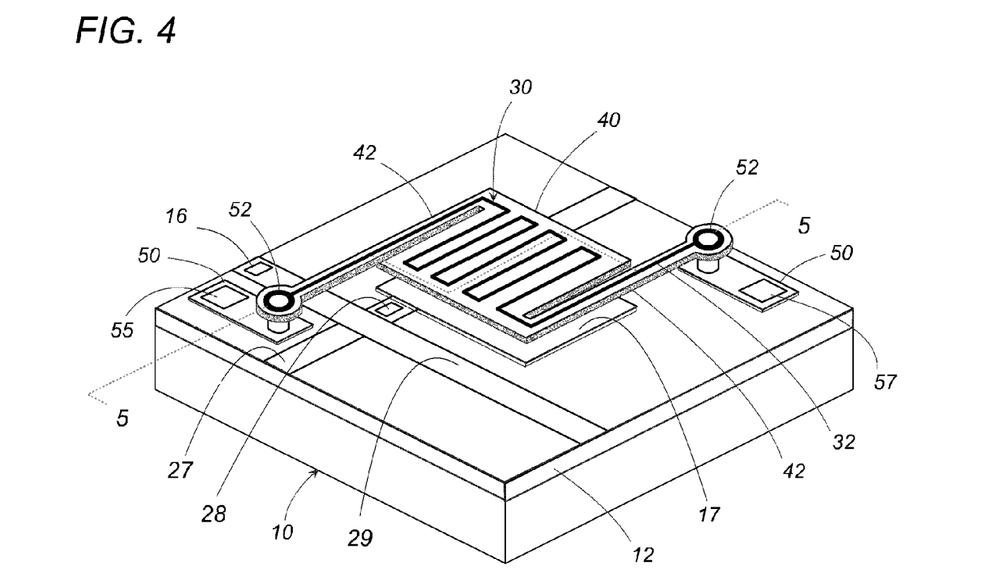
FIG. 4 is a perspective view of a sensor unit included in the above sensor.
Figure 5:
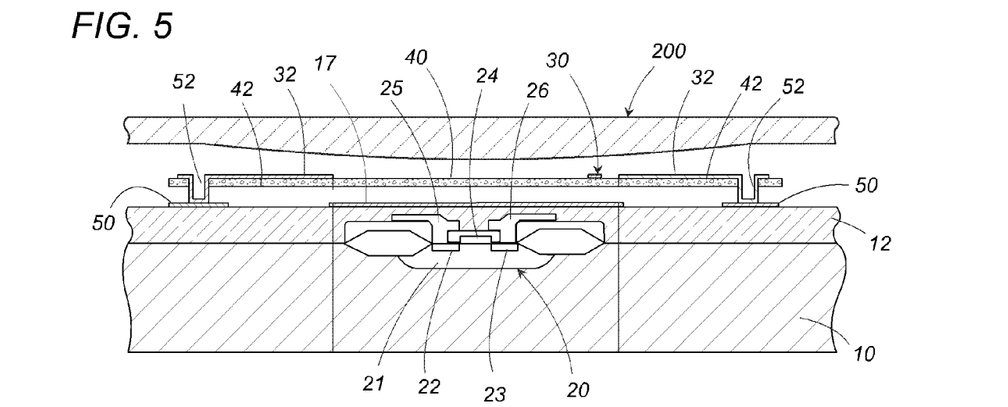
FIG. 5 is a sectional view taken along line 5-5 of FIG. 4.

As shown in FIGS. 4 and 5, each sensor unit 100 includes a semiconductor device 20 formed in the top surface of the semiconductor substrate 10 and a thermal infrared sensing element 30 supported to the substrate 10 in a spaced relation with the semiconductor device 20. The semiconductor device 20 is electrically coupled to the infrared sensing element 30 to provide a sensor output to an external processing circuit where the sensor output is analyzed in terms of the amount the infrared radiation received at the infrared sensing element 30 for temperature measurement or determination of presence of an object emitting the infrared radiation.

The semiconductor device 20 is, for instance, a MOSFET transistor which is turned on and off to provide the sensor output in response to a trigger signal applied to the transistor. The transistor is fabricated by a well-know technique in the top surface of the substrate 10 and comprises a doped well region 21 with a drain 22 and a source 23, a gate 24, a drain electrode 25, source electrode 26, and a gate electrode 28. The electrodes are electrically connected respectively to terminal pads exposed on top of the sensor unit. Hereinafter, the term "transistor" is utilized as representative of the semiconductor device 20, although the present invention is not limited to the use of the illustrated single transistor. A dielectric layer 12 made of $SiO_2$ or SiN, for example, is formed on substantially the entire top surface of the substrate 10 to conceal therebehind the transistor 20. When the transistor 20 is associated with electrodes on top of the substrate, the dielectric layer 12 is formed to cover the entire top surface of the substrate except for the electrodes.

Each sensor unit 100 includes a sensor mount 40 for carrying thereon the sensing element 30, a pair of horizontal beams 42 integrally extending from the opposite sides of the sensor mount 40 in the same plane thereof for supporting the sensor mount to the substrate 10, and a pair of terminal lands 50 formed on the top surface of the substrate 10. The thermal infrared sensing element 30 is made of a metal such titanium nitride deposited on the sensor mount 40 to form a patterned strip which gives a varying electric resistance in proportion to the amount or intensity of the incident infrared radiation, and includes a pair of conductor or leads 32 which extends on and along the beams 42 for electrical connection respectively with the terminal lands 50. The sensor mount 40 and the beams 42 are made of a porous material in order to thermally isolate the infrared sensing element 30 effectively from the substrate 10 and the transistor 20. The porous material utilized in this embodiment is porous silica ($SiO_2$), and may be one of a siloxane-based organic polymer, or a siloxane-based inorganic polymer.

Figure 7:
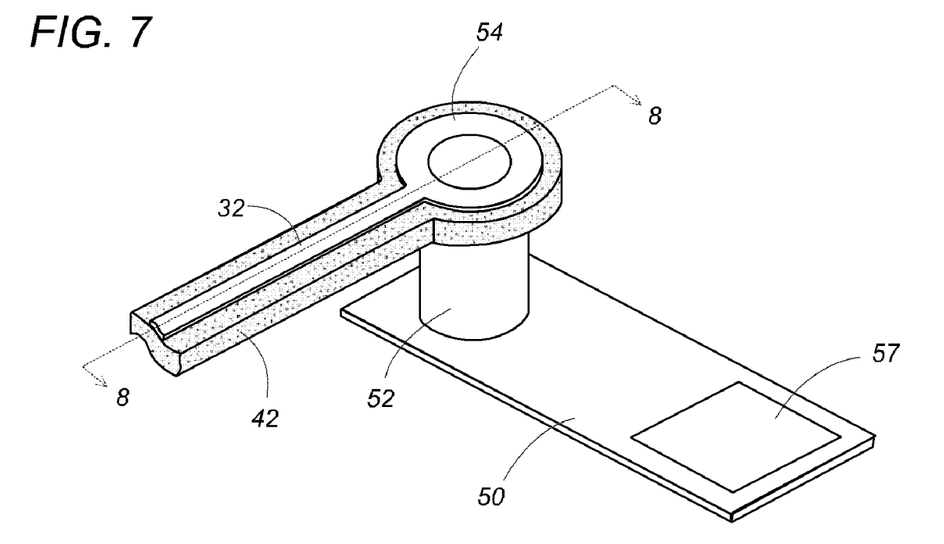
FIG. 7 is an enlarged partial perspective view of a portion of the above sensor unit.
Figure 8:
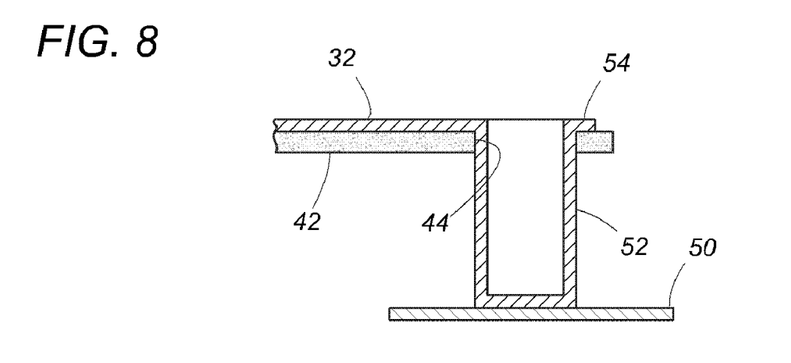
FIG. 8 is a sectional view taken along line 8-8 of FIG. 7.

Each terminal land 50 is provided with an anchor stud 52 which projects upwardly to hold a distal end of each associated beam 42 so as to locate the sensor mount 40 at a height above the top surface of the substrate 10, thereby maintaining the sensing element in a spaced relation upwardly from the top surface of the substrate 10, i.e., immediately upwardly of the transistor 20. The anchor stud 52 is made of the same material as the sensing element 30 and merges at its upper end with the lead 32. As best shown in FIGS. 7 and 8, the anchor stud 42 is in the form of a hollow cylinder of which upper end is fitted into a hole 44 formed in the end of the associated beam 42. The anchor stud 52 is formed at its upper end with a flange 54 which overlaps on the beam 42 around the hole 44 and merges at its one circumference into the end of the lead 32 running on the beam 42. Since the leads 32 are made integral respectively with the upright anchor studs 52 on the substrate 10, the infrared sensing element 30 is supported to the substrate 10 by means of the leads 32 and the anchor studs 52 so as to be kept spaced from the top surface of the substrate 10 at a height exactly corresponding to the length of the anchor studs 52. As will be discussed hereinafter, the sensing element 30 and the leads 32 are deposited respectively on the sensor mount 40 and the beams 42 to develop an intermolecular adhesion force which secures sensor mount 40 and the beams 42 respectively to the sensing element 30 and the leads 32. With this result, the sensor mount 40 and the beams 42 are carried by the sensing element 30 and the leads 32 secured to the anchor studs 52, and are therefore also supported to the substrate 10 by means of the anchor studs 52. Since the anchor stud 52 fits into the hole 44 in the end of the beam 42, the end of the beam 42 surrounds the entire circumference of the upper end of the anchor stud 52, and is consequently secured to the upper end of the anchor stud 52 also by the intermolecular adhesion around the hole 44 for successful support of the beam 42 or the sensor mount 40 to the anchor stud 52 or the substrate 10. Further, the flange 54 gives an increased contact surface area with the beam 42 around the entire circumference of the hole 44 to give an additional intermolecular adhesion force for stably supporting the beam 42 to the anchor stud 52.

Figure 6:
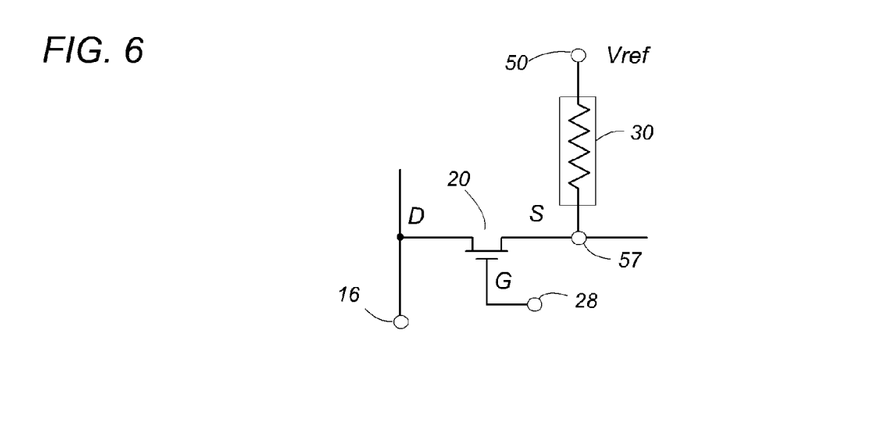
FIG. 6 is a circuit diagram of the above sensor unit.

The terminal lands 50 are provided respectively with pads 55 and 57 for connection respectively with a reference voltage source Vref, and the source electrode 26 of the transistor 20, as shown in FIG. 6. The gate electrode (not seen in FIG. 5) is connected through a buried line 27 to corresponding terminal pad 28 for connection with an external circuit of controlling the transistor 20 to turn on and off. The drain electrode 25 is connected through a buried line 29 to a terminal pad 16 to give the sensor output to an external circuit for detection of the infrared radiation from a target object.

An infrared reflector 17 made of a metal, for example, aluminum is formed on top of the dielectric top layer 12 in order to reflect the infrared radiation passing through the infrared sensing element 30 back thereto for enhanced sensitivity. The distance (d) between infrared sensing element 30 and the infrared reflector 17 is set to be d=$\lambda$/4, where $\lambda$ is a wavelength of the infrared radiation from the target object. When using the infrared sensor for human detection, the distance is set to be 2.5 µm since the wavelength ($\lambda$) of the infrared radiation from the human is 10 µm.

The porosity of the porous material is preferred to be within a range of 40% to 80% for assuring sufficient mechanical strength and at the same time good thermal insulation effect.

It is noted in this connection that the porous silica ($SiO_2$) has a superior thermal isolation effect for satisfying minimum thermal conductance through the beams 42 to the substrate 10 and yet assuring minimum thermal capacity to the sensor mount 40, thereby improving the sensitivity of the infrared sensor.

Figure 9:
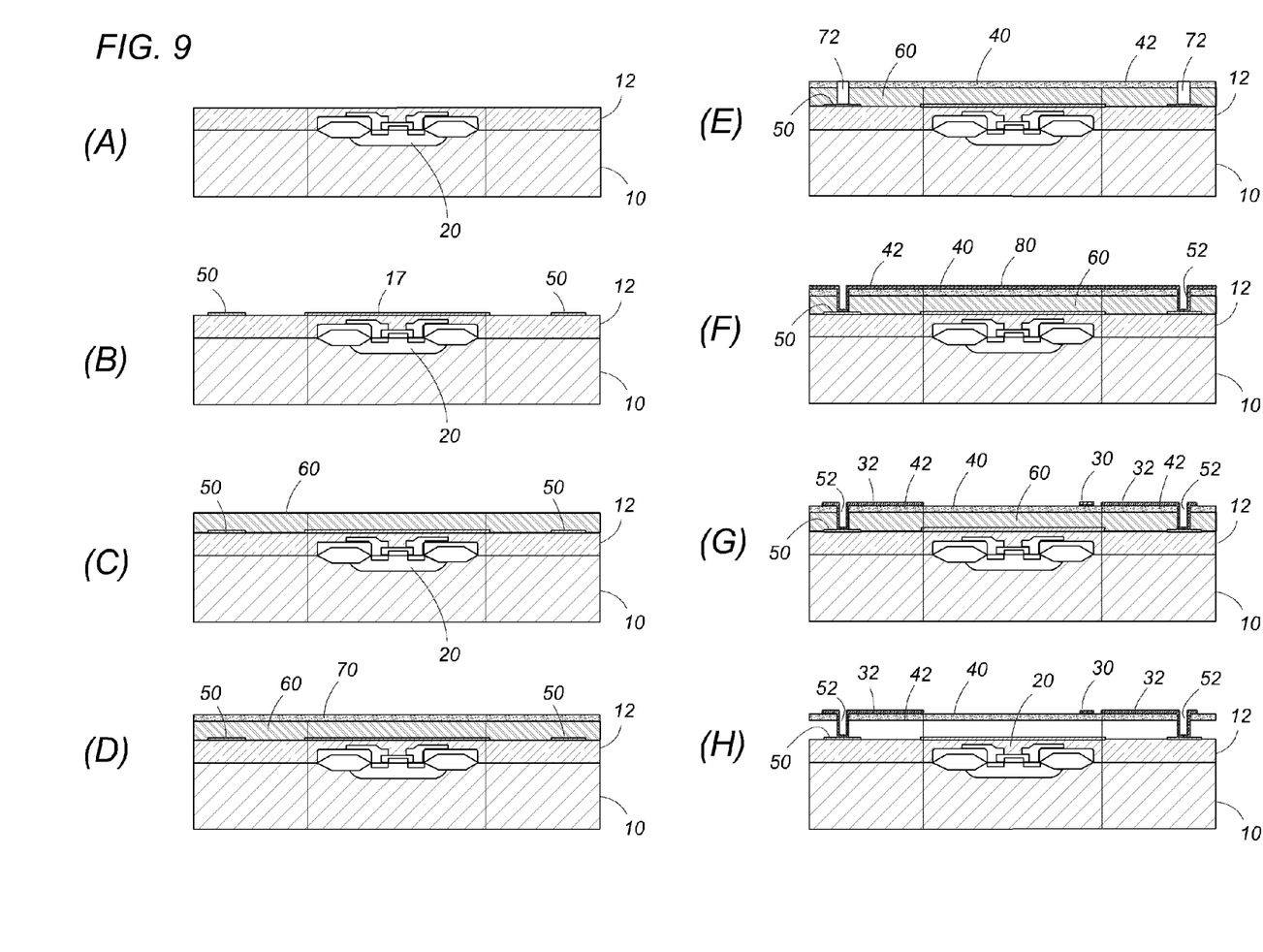
FIG. 9, composed of (A) to (H), is a sectional view illustrating steps of fabricating the above sensor unit.

The sensor unit of the above configuration is fabricated through the steps shown in FIGS. 9A to 9H. After forming the transistor 20 on top of the semiconductor substrate 10, the dielectric top layer 12 of $SiO_2$ is formed to cover the entire top surface of the substrate 10 by thermal oxidization, as shown in FIG. 9A. Alternatively, the dielectric top layer 12 of SiN is formed by chemical vapor deposition. Then, aluminum layer is deposited by spattering on the dielectric top layer 12 followed by being selectively etched out to leave the terminal lands 50 and the infrared reflector 17 on the dielectric top layer 12, as shown in FIG. 9B. Then, a sacrifice layer 60 of a suitable resist material is applied by a spin coating technique to the entire top surface of the dielectric top layer 12, as shown in FIG. 9C. The sacrifice layer 60 may be alternatively made of a polyimide formed by the spin coating, or of a meal formed by deposition or even of a polysilicon formed by chemical vapor deposition.

Subsequently, a solution of porous silica ($SiO_2$) is applied over the sacrifice layer 60 by the spin coating technique to form a porous layer 70, as shown in FIG. 9D. Thereafter, the porous layer 70 is masked by a suitable resist and selectively etched out to develop the sensor mount 40 and the respective beams 42, and at the same time to form through-holes 72 extending in the porous layer 70 and the sacrifice layer 60 and leading to the terminal lands 50, as shown in FIG. 9E. The through-holes 72 may be formed by lithography, dry-etching, or wet-etching. Next, an electrically conductive layer 80 of titanium is deposited by spattering on the sensor mount 40, the beams 42 and into the through-holes 72 followed by being coated with a protective layer of titanium nitride by spattering, as show in FIG. 9F. Then, the conductive layer 80 and the protective layer are selectively etched out to leave the patterned strip of the infrared sensing element 30 on the sensor mount 40 and the leads 32 on the corresponding beams 42, while at the same time leaving the anchor studs 52 with the flange 54 respectively in the through-holes 72 to complete the electrical connection of the sensing element 30 to the terminal lands 50, as shown in FIG. 9G. Thus, the anchor studs 52 are made integral and continuous with the leads 32 and therefore the sensing element 30 so that these parts are combined into a unitary structure. Finally, the sacrifice layer 60 is etched out to obtain the sensor unit, as shown in FIG. 9H.

The electrically conductive material forming the sensing element 30, the leads 32, and the anchor studs 52 may be either of titanium or chromium which is covered with any one of titanium nitride and gold. The sensing element 30, the leads 32, and the anchor studs 52 of the unitary structure is preferred to have a uniform thickness of 0.2 µm or more.

Figure 10:
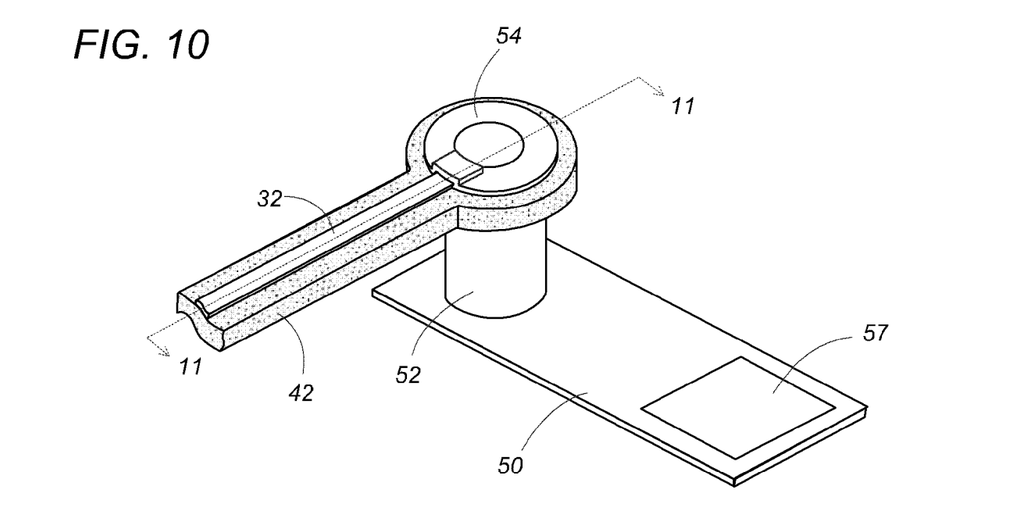
FIG. 10 is a partial perspective view of a portion of a modification of the above sensor unit.
Figure 11:
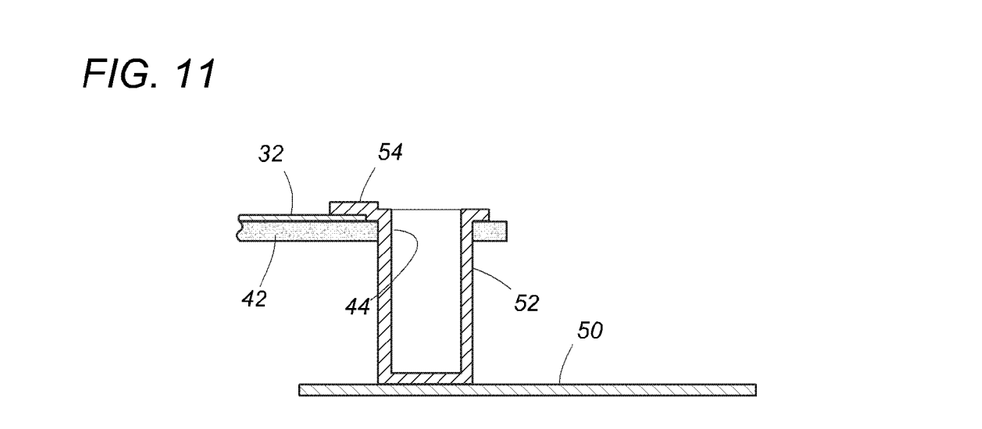
FIG. 11 is a sectional view take along line 11-11 of FIG. 10.

FIGS. 10 and 11 illustrate a modification of the above embodiment which is identical to the above embodiment except that the anchor stud 52 is formed separately from the lead 32, but is secured thereto. This modification is particularly advantageous when the leads 32 and the sensing element 30 has a reduced thickness for improved sensitivity to the incident infrared radiation, while the sensing element 30 as well as the sensor mount 40 are stably supported to the anchor studs 52. For example, the sensing element 30 and the leads 32 are selected to have a thickness of less than 0.2 μm, while the anchor stud 52 is designed to have a thickness of 0.2 μm or more. In the modification, the lead 32 has its end bonded to a portion of the flange 54 as being overlapped therewith so that the sensing element 30 is securely supported to the anchor stud 52.

Figure 12:
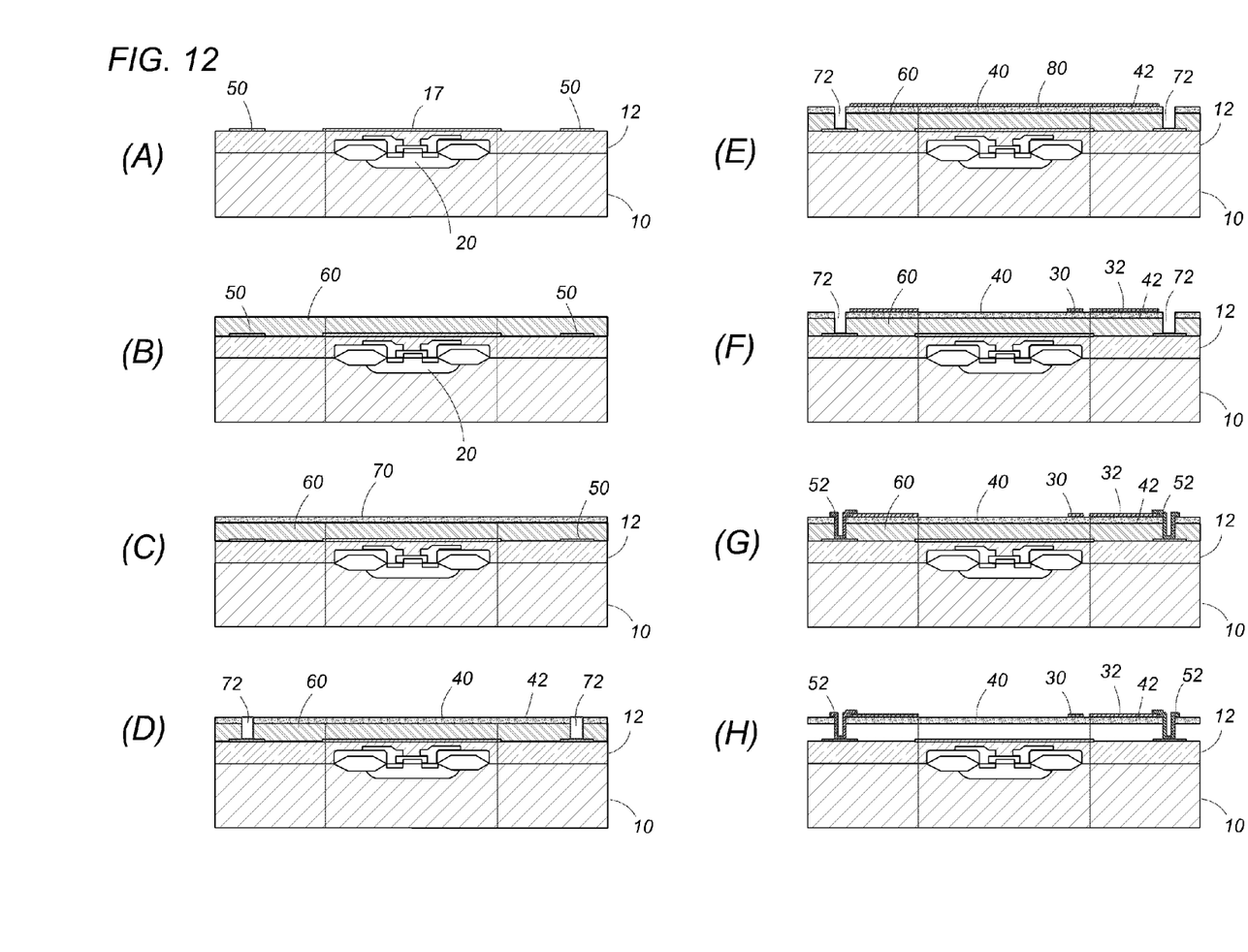
FIG. 12, composed of (A) to (H), is a sectional view illustrating steps of fabricating the above modification of the sensor unit.

FIGS. 12A to 12H illustrate the steps of fabricating the sensor unit according to the modification. After forming the terminal lands 50 and the infrared reflector 17 on the dielectric top layer 12 of the substrate 10 which is formed in its top surface with transistor 20 (FIG. 12A), a sacrifice layer 60 of a suitable resist material is applied by a spin coating technique to the entire top surface of the dielectric top layer 12, as shown in FIG. 12B. Then, a solution of porous silica ($SiO_2$) is applied over the sacrifice layer 60 by the spin coating technique to form a porous layer 70, as shown in FIG. 12C. Thereafter, the porous layer 70 is masked by a suitable resist and selectively etched out to develop the sensor mount 40 and the respective beams 42, and at the same time to form through-holes 72 extending in the porous layer 70 and the sacrifice layer 60 and leading to the terminal lands 50, as shown in FIG. 12D. Subsequently, an electrically conductive layer of titanium or chromium is deposed by spattering on the sensor mount 40 and the beams 42 followed by coated with a protective layer of titanium nitride or gold by spattering, as shown in FIG. 12E. Then, the conductive layer 80 and the protecting layer are selectively etched out to leave the patterned strip of the infrared sensing element 30 on the sensor mount 40 and the leads 32 on the corresponding beams 42, as shown in FIG. 12F. After spattering to deposit another electrical conductive material of titanium or chromium into the through-holes 72 and partly on the ends of the leads 32 with a thickness greater than that of the sensing element 30 and the leads 32, the material is selectively etched out to develop the anchor studs 52, as shown in FIG. 12G. At this step, the anchor studs 52 are bonded respectively to the leads 32 at the flanges 54 so that sensing element 30, the leads 32, the sensor mount 40 and the beams 42 are supported to the anchor studs 52. Finally, the sacrifice layer 60 is etched out to obtain the sensor unit, as shown in FIG. 12H.

Figure 13:
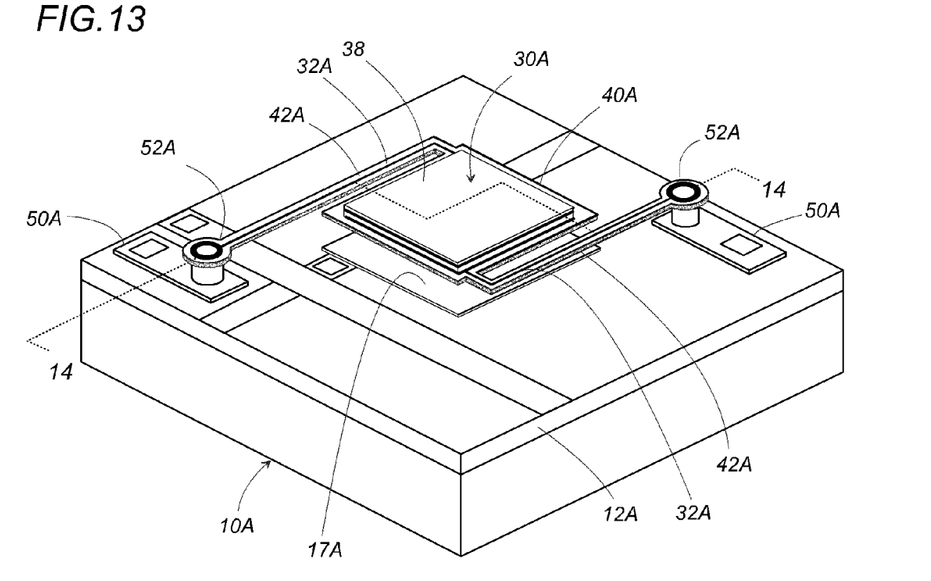
FIG. 13 is an enlarged perspective view of a sensor unit in accordance with a second embodiment of the present invention.
Figure 14:
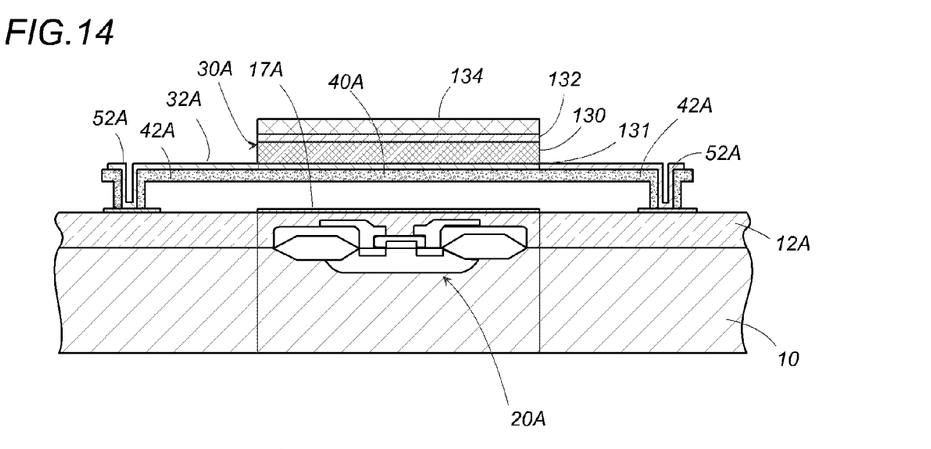
FIG. 14 is a sectional view taken along line 14-14 of FIG. 13.
Figure 15:
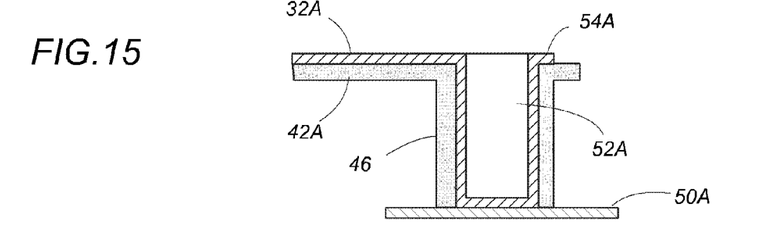
FIG. 15 is a sectional view of a portion of the above sensor unit.

FIGS. 13 to 15 illustrate a sensor unit in accordance with a second embodiment of the present invention which is identical to the first embodiment except for a structure of the thermal infrared sensing element 30A. Like parts are designated by like reference numerals with a suffix letter of "A", and no duplicate explanation is made herein for the purpose of simplicity.

The thermal infrared sensing element 30A is composed of a resistive layer 130 of an amorphous silicon held between a lower electrode 131 and an upper electrode 132 which are respectively connected through leads 32A to the terminal lands 50A. The resistive layer 130 exhibits a varying electric resistance between the upper and lower electrodes in response to the change of the amount of the incident infrared radiation. Thus configured infrared sensing element 30A is carried on a sensor mount 40A and is supported to the anchor studs 52A together with the sensor mount 40A. The anchor studs 52A are deposited on the terminal lands 50A to project upwardly therefrom, and are formed at their upper ends respectively with a flange 54A which merge with the leads 32 respectively extending from the upper and lower electrodes 131 and 132. Thus, the whole sensing element 30A including the leads 32A are made integral with the anchor studs 52A and is supported to the substrate 10A in a spaced relation therewith. A pair of beams 42 extends integrally from the sensor mount 40A of the porous material to carry thereon the leads 32A such that the sensing element 30A and the leads 32A are thermally insulated from the substrate 10A. Each anchor stud 52A is surrounded by a sleeve 46 which is made integral with the associated beam 42A, as shown in FIG. 15. The beams 42A and the sleeves 46 are adhered respectively to the leads 32A and the anchor studs 52A by the intermolecular force, to be thereby also supported to the substrate 10A by means of the anchor studs 52A. An infrared absorber 134 is deposited on the upper electrode 132 to effectively collect the infrared radiation. The infrared absorber 134 may be formed by SiON, $Si_3N_4$, $SiO_2$, or gold black.

Figure 16:
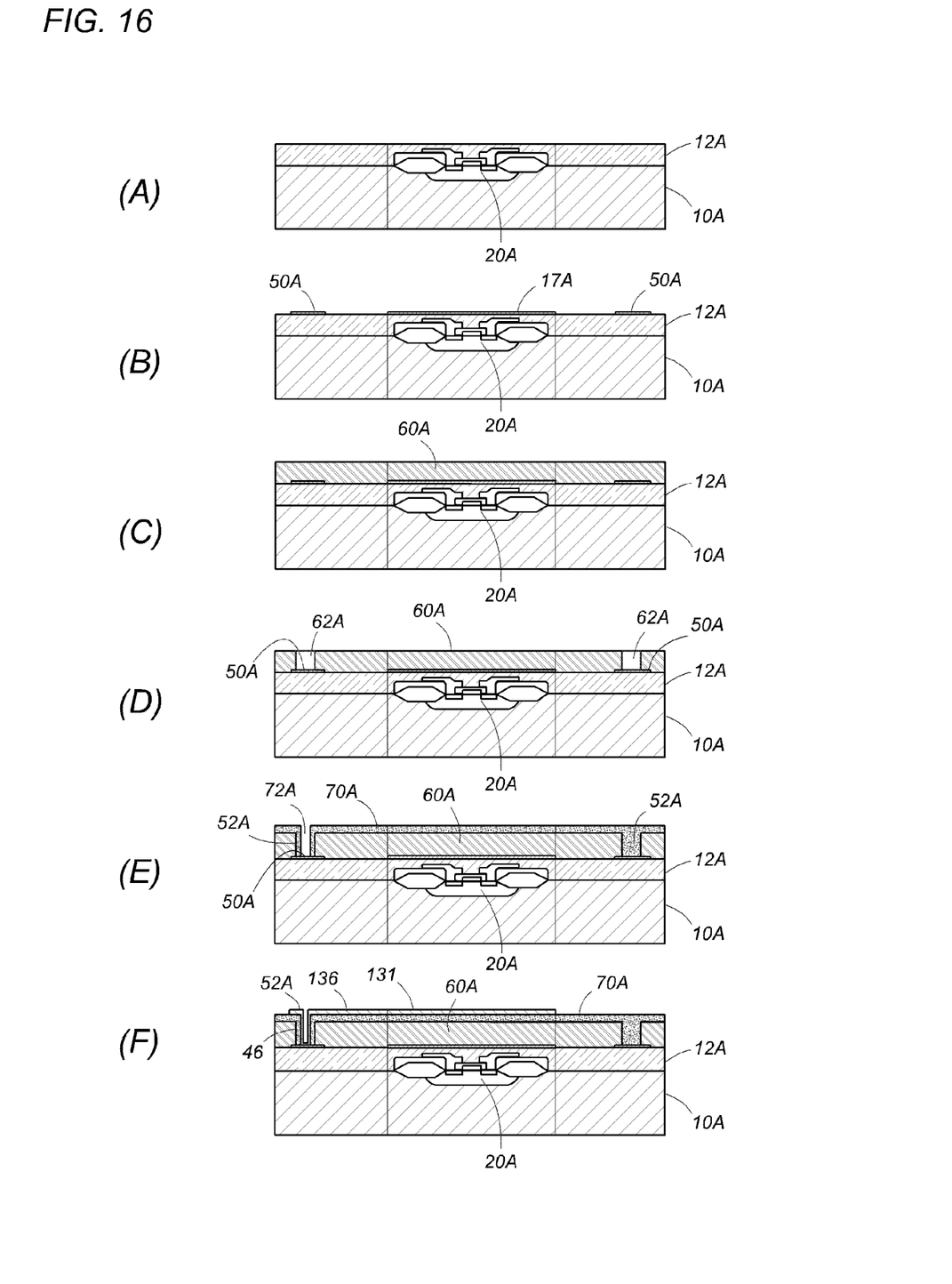
FIG. 16, composed of (A) to (K), is a sectional view illustrating the steps of fabricating the sensor unit of FIG. 13.

The process of fabricating the above sensor unit will be now explained with reference to FIGS. 16A to 16K. After forming the transistor 20A on top of the semiconductor substrate 10A of monocrystal silicon, the dielectric top layer 12A of $SiO_2$ is formed to cover the entire top surface of the substrate 10A by thermal oxidation, as shown in FIG. 16A. Then, aluminum layer is deposited by spattering on the dielectric top layer 12A followed by being selectively etched out to leave the terminal lands 50A, and the infrared reflector 17A on the dielectric top layer 12A, as shown in FIG. 16B. Then, a sacrifice layer 60A of a suitable resist material is applied by a spin coating technique to the entire top surface of the dielectric top layer 12A, as shown in FIG. 16C. Then, portions of the sacrifice layer 60A is etched out to leave a pair of through-holes 62A each exposing the terminal lands 50A, as shown in FIG. 16D. Subsequently, a solution of porous silica ($SiO_2$) is applied over the sacrifice layer 60A by the spin coating technique to form a porous layer 70A extending over the sacrifice layer 60A and into the through-holes 62A, after which the porous material in one of the through-holes 62A is partly etched out to form a via-hole 72A exposing the terminal land 50A, as shown in FIG. 16E.

Next, chrominum is deposited by spattering on the porous layer 70A and also into the via-hole 72A followed by being selectively etched out to form the lower electrode 131 and the associated lead 32A on the porous layer 70A, and at the same time to develop the anchor stud 52A surrounded by the sleeve 46 of the porous material, as shown in FIG. 16F. Amorphous silicon is then deposited by chemical vapor deposition (CVD) method on the porous layer 70A over the lower electrode 131 followed by being selectively etched out to form the resistive layer 130 on the lower electrode 131, as shown in FIG. 16G. Then, the porous layer 70A extending into the remaining through-hole 62A is selectively etched out to leave another via-hole 72A exposing the associated terminal land 50A, as shown in FIG. 16H. Chrominum is then deposited on the porous layer 70A and the resistive layer 130, and is selectively etched out to form the upper electrode 132 and the associated lead 32A extending therefrom, as shown in FIG. 16I. At this step, the chromium is deposited also into the via-hole 72A to develop the anchor stud 52A which joins the lead 32A to the associated terminal land 50A. Thus, the leads 32A of the sensing element 30A are made integral with the anchor studs 52A to thereby support the sensing element 30A to the substrate 10A by means of the anchor studs 52A. Then, a SiON layer is deposited on the porous layer 70A over the upper electrode 132, and is subsequently etched out to form the infrared absorber 134 on top of the upper electrode 132, as shown in FIG. 16J. After the porous layer 70A is masked by a suitable resist and selectively etched out to leave the sensor mount 40A and the respective beams 42A, the sacrifice layer 60A is etched out to obtain the sensor unit, as shown in FIG. 7K.

In the above illustrated embodiments, the porous layer or the correspondingly formed parts are made of porous silica. However, the present invention may use another porous material including a siloxane-based organic polymer such as methyl-containing polysiloxane, siloxane-based inorganic polymer such as SiH containing siloxane, and silica aerogel.

Further, the porous material may be a porous matrix composite including hollow minute particles and a matrix-forming material. The hollow minute particle is defined to have a cavity surrounded by a shell which is preferably made of a metal oxide or silica. The hollow minute particle may be selected from those disclosed in the patent publication JP 2001-233611 or commercially available. Particularly, the shell is made of a material selected alone or in combination from $SiO_2$, $SiO_x$, $TiO_2$, $TiO_x$, $SnO_2$, $CeO_2$, $Sb_2O_5$, ITO, ATO, and $Al_2O_3$. After being coated on the substrate and dried, the porous matrix composite gives the porous layer having low thermal conductivity and low specific heat. Within the porous layer, the hollow minute particles are dispersed as fillers and are bound in the matrix. The matrix-forming material may be a silicon compound of a first type containing siloxane bond or silicon compound of a second type which develops siloxane bonds while being formed into a film or layer. The silicon compound of the second type may contain the siloxane bond. The silicon compounds of the first and second types include an organic silicon compound, silicon halide compound (for example, silicon chloride and silicon fluoride), and organic silicon halide compound containing organic group and halogen.

Figure 17:
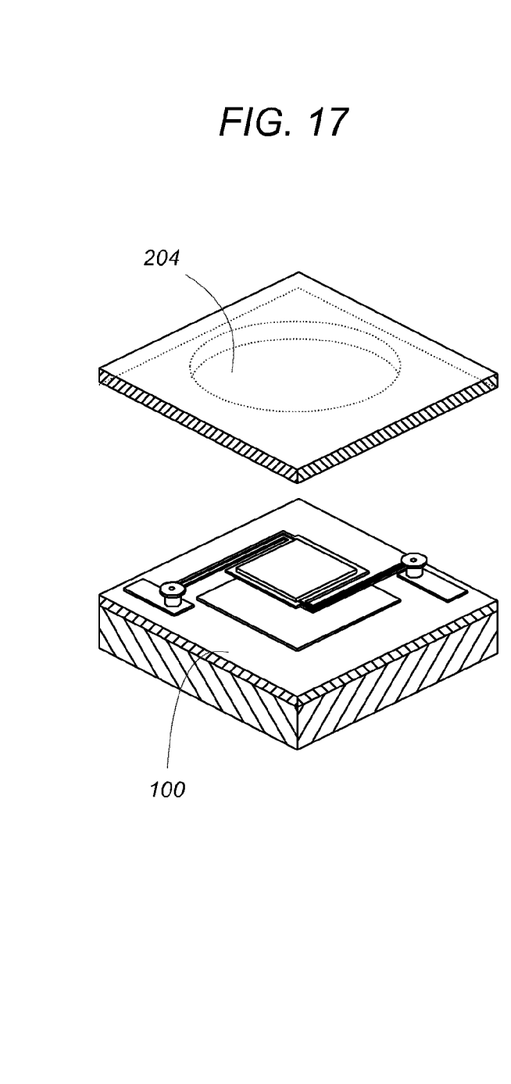
FIGS. 17 to 19 are perspective views illustrating modifications of the above infrared sensor.
Figure 18:
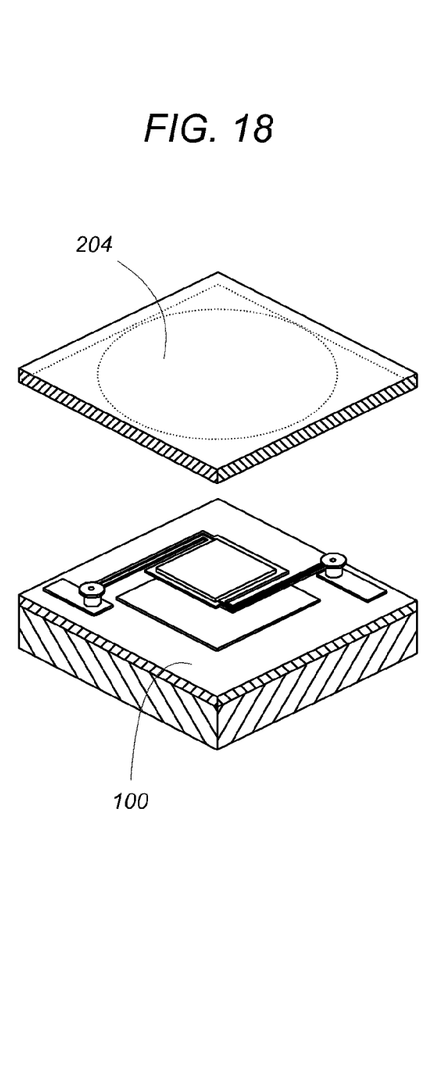
Figure 19:
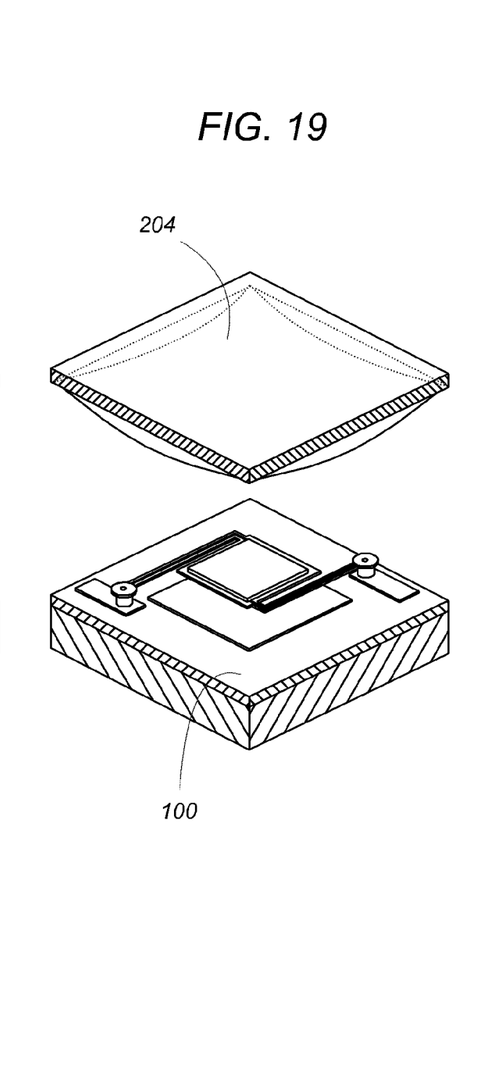

FIGS. 17 to 19 illustrate various lens configurations of the lens array which may be equally utilized in the present invention. Each of the sensor unit 100 is arranged in a unit square which defines a picture segment of the infrared sensor. In this connection, each lens 204 of the lens array may be dimensioned to have a circular convex lens of which diameter is smaller than the side of the unit square (FIG. 17), equal to a side of the square (FIG. 18), or even to have convex lens which is square in planar configuration to cover the whole unit square (FIG. 19).

Figure 20:
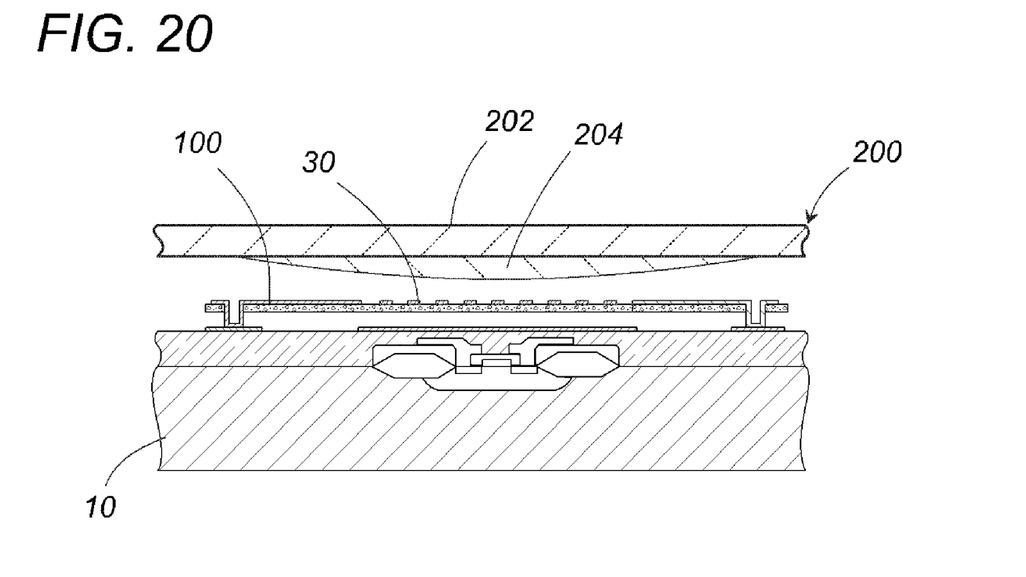
FIG. 20 is a sectional view illustrating another modification of the above infrared sensor.

FIG. 20 illustrates a modification of the above embodiment in which the window 202 of the sealing cap 200 is additionally formed on its interior surface opposing the sensor unit 100 with an array of separate convex lenses 204 of which refractive index is smaller than that of the window 202 or the sealing cap 200. For example, the sealing cap 200 is made of Si having a refractive index of 3.4, while the lens 204 is made of $SiO_2$ having a refractive index of 1.5. This arrangement is effective to reduce a total amount of respective reflections occurring at individual interfaces between different media while the infrared radiation is directed through the window and the lens to the sensing element 30, and therefore improve the transmissivity of the infrared radiation through the sealing cap 200. The sealing cap 200 may be made from another material such as Ge, InP, ZnSe, ZnS, $Al_2O_3$, and CdSe, while the lens may be made from a suitable material having the refractive index smaller than the sealing cap. Further, the window 202 may be coated on its exterior surface away from the lens with a transmissive layer having a refractive index smaller than that of the sealing cap 200 for further improving transmissivity of the infrared radiation.

Although the above embodiments show the use of the infrared sensing element which exhibits an electrical resistance varying in response to the amount or changing rate of the amount of the incident infrared radiation, it is equally possible to utilize another sensing element of a type exhibiting a varying permittivity, of a thermopile type generating a thermal electromotive force, or of a pyroelectric type generating a voltage difference in response to the change rate of the amount of the infrared radiation.

In addition, the infrared sensor of the present invention is illustrated in the above embodiments to include a plurality of the sensor units, however, the present invention should not be limited to this specific arrangement and encompass the use of a single sensor unit. While the illustrated embodiments are described to include the semiconductor device in the substrate, the present invention should be interpreted to cover possible modifications without the semiconductor device.

The invention claimed is:

1. An infrared sensor comprising:
a substrate;
a sensor unit comprising:
   a thermal infrared sensing element;
   a sensor mount made of a porous material and carrying thereon said thermal infrared sensing element;
   a pair of beams made of the porous material and extending integrally from said sensor mount for supporting said sensor mount in a spaced relation upwardly from a top surface of said substrate; and
   a pair of terminal lands formed on the top surface of said substrate; and
a sealing cap secured to said substrate to provide a hermetically sealed space therebetween for accommodating said sensor unit, said sealing cap having a window which passes an incident infrared radiation on said thermal infrared sensing element of said sensor unit;
said thermal infrared sensing element having a pair of leads each supported on top of each of said beams to extend along the beam for electrical connection with each corresponding one of said terminal lands,
wherein said beams extend in the same plane of said sensor mount in a spaced relation with the top surface of said substrate to carry the respective leads thereon, and
said sensor unit further includes a pair of anchor studs each upstanding from each of said terminal lands and secured at its upper end to a distal end of each corresponding one of said leads such that said sensing element is supported on said substrate together, with said sensor mount in a spaced relation from the top surface of said substrate and is electrically connected to said terminal lands through said anchor studs,
the upper end of each of said anchor studs being embedded in each corresponding one of said beams so as to have its circumference entirely surrounded by each corresponding one of said beams, and
wherein each of said anchor studs is surrounded along its vertical length by each one of sleeves of a porous material.

2. An infrared sensor as set forth in claim 1, wherein
each of said leads are deposited on each corresponding one of said beams, and
each of said anchor studs has its upper end fitted within a hole formed in the end of each corresponding one of said beams,
each of said anchor studs being formed at its upper end with a flange which overlaps on said beam around said hole and is connected to each corresponding one of said leads.

3. An infrared sensor as set forth in claim 2, wherein
each said lead and the associated anchor stud are commonly made of an electrically conductive material to be continuous with each other.

4. An infrared sensor as set forth in claim 2, wherein
said flange of each said anchor stud has a portion overlapped with the end of each said lead to be bonded together thereat.

5. An infrared sensor as set forth in claim 4, wherein each said anchor stud is in the form of a hollow cylinder having a uniform thickness which is greater than that of each said lead.

6. An infrared sensor as set forth in claim 1, wherein said sleeve is formed integrally with said beam as an integral part thereof.

7. An infrared sensor as set forth in claim 1, wherein said sensor mount is formed from the porous material selected from a group consisting of a silicon oxide, a siloxane-based organic polymer, and a siloxane-based inorganic polymer.

8. An infrared sensor as set forth in claim 1, wherein said hermetically sealed space is decompressed.

9. An infrared sensor as set forth in claim 1, wherein an array of a plurality of said sensor units are arranged on said substrate.

10. An infrared sensor as set forth in claim 9, wherein said window is provided with a lens array in which a plurality of optical lenses are arranged in an array so as to converge the incident infrared radiation on said infrared sensor of any one of said sensor units.

11. An infrared sensor as set forth in claim 10, wherein said lens array is integrally formed with said sealing cap to form a part of said sealing cap.

12. An infrared sensor as set forth in claim 11, wherein said lens array is superimposed on said window on a surface of said sealing cap opposed to said sensor units, said lens array having a refractive index smaller than that of said window.

\* \* \* \* \*